(12) United States Patent
Karda et al.

(10) Patent No.: US 11,043,260 B2
(45) Date of Patent: *Jun. 22, 2021

(54) SINGLE WORD LINE GAIN CELL WITH COMPLEMENTARY READ WRITE CHANNEL

(71) Applicant: Micron Technology, Inc., Boise, ID (US)

(72) Inventors: Kamal M. Karda, Boise, ID (US); Haitao Liu, Boise, ID (US); Karthik Sarpatwari, Boise, ID (US); Durai Vishak Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/722,665

(22) Filed: Dec. 20, 2019

(65) Prior Publication Data

US 2020/0211629 A1    Jul. 2, 2020

Related U.S. Application Data

(60) Provisional application No. 62/785,163, filed on Dec. 26, 2018.

(51) Int. Cl.
  *G11C 11/40*       (2006.01)
  *G11C 11/4096*   (2006.01)
  (Continued)

(52) U.S. Cl.
  CPC ...... *G11C 11/4096* (2013.01); *G11C 11/4094* (2013.01); *H01L 27/10897* (2013.01)

(58) Field of Classification Search
  CPC ............ G11C 11/4096; G11C 11/4094; H01L 27/10897; H01L 27/11582; H01L 29/7889
  See application file for complete search history.

(56) References Cited

U.S. PATENT DOCUMENTS 6,396,745 B1    5/2002   Hong et al.
6,757,196 B1    6/2004   Tsao et al.
(Continued)

OTHER PUBLICATIONS

William D. Brown; Joe Brewer, "SONOS Nonvolatile Semiconductor Memories," in Nonvolatile Semiconductor Memory Technology: A Comprehensive Guide to Understanding and Using NVSM Devices , IEEE, 1998, pp. 309-357, doi: 10.1109/9780470545409.ch5. (Year: 1998).*

(Continued)

*Primary Examiner* — Ajay Ojha
(74) *Attorney, Agent, or Firm* — Schwegman Lundberg & Woessner, P.A.

(57) ABSTRACT

Some embodiments include apparatuses and methods of forming the apparatuses. One of the apparatuses includes multiple two-transistor (2T) memory cells. Each of the multiple 2T memory cells includes: a p-channel field effect transistor (PFET) including a charge storage node and a read channel portion, an n-channel field effect transistor (NFET) including a write channel portion that is directly coupled to the charge storage node of the PFET; a single bit line pair coupled to the read channel portion of the PFET; and a single access line overlapping at least part of each of the read channel portion and the write channel portion.

24 Claims, 11 Drawing Sheets

(51) Int. Cl.
*H01L 27/108* (2006.01)
*G11C 11/4094* (2006.01)

(56) References Cited

U.S. PATENT DOCUMENTS

| | | |
|---|---|---|
| 2013/0077397 A1 | 3/2013 | Kurita et al. |
| 2013/0256774 A1 | 10/2013 | Jeon et al. |
| 2018/0061834 A1 | 3/2018 | Derner et al. |
| 2020/0211631 A1* | 7/2020 | Karda ................ G11C 11/4097 |

OTHER PUBLICATIONS

"International Application Serial No. PCT US2019 067822, International Search Report dated Apr. 29, 2020", 3 pgs.
"International Application Serial No. PCT US2019 067822, Written Opinion dated Apr. 29, 2020", 4 pgs.

* cited by examiner

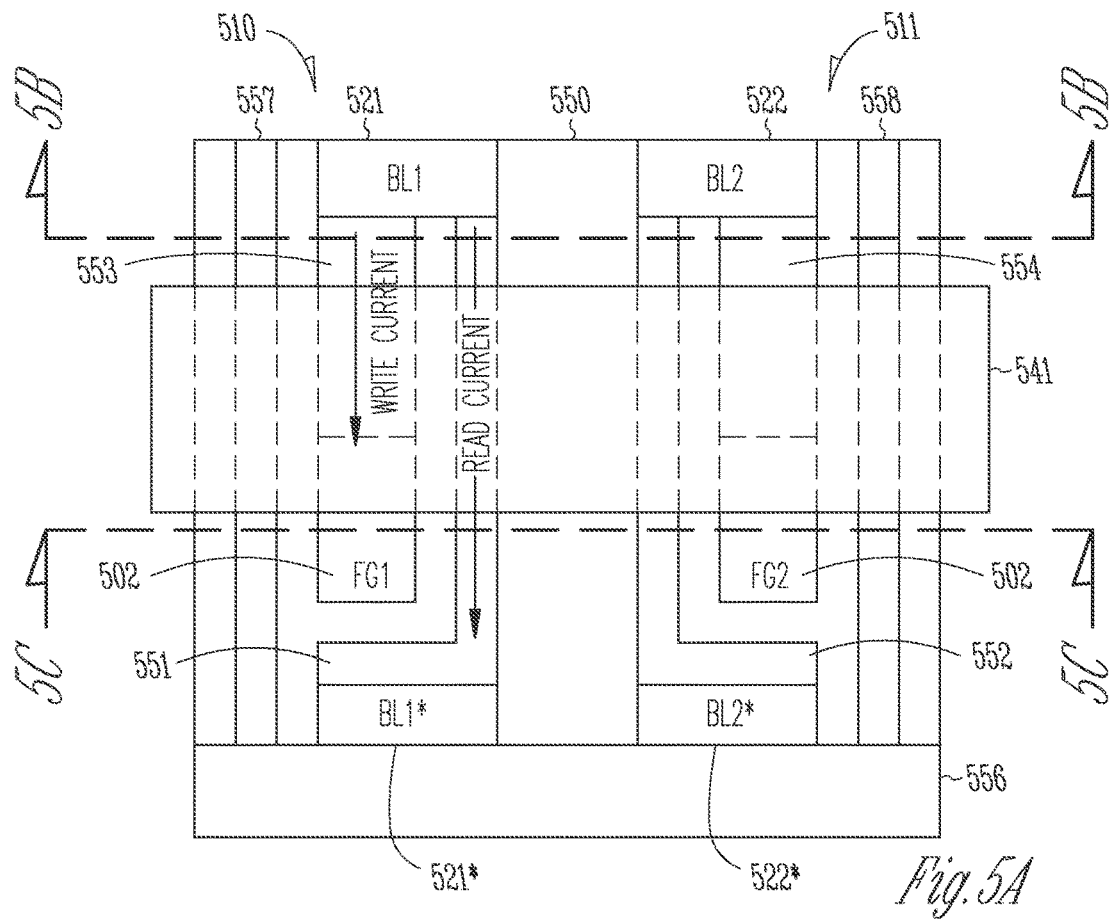
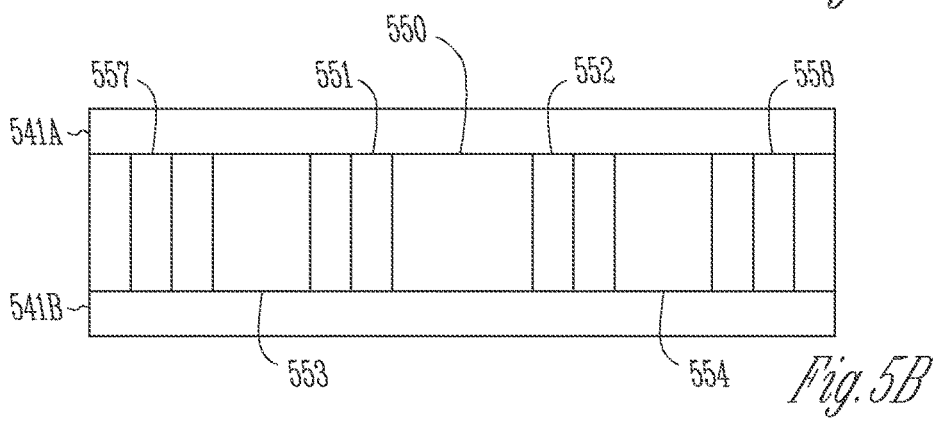
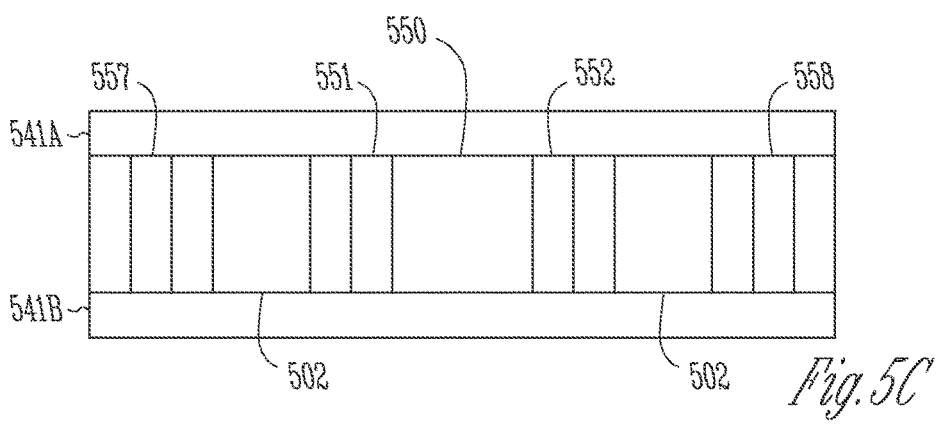

SINGLE WORD LINE GAIN CELL WITH COMPLEMENTARY READ WRITE CHANNEL

PRIORITY APPLICATIONS

This application claims the benefit of priority to U.S. Provisional Application Ser. No. 62/785,163, filed Dec. 26, 2018 which is incorporated herein by reference in their entirety.

BACKGROUND

Memory devices are widely used in computers and many other electronic items to store information. Memory devices are generally categorized into two types: volatile memory device and non-volatile memory device. An example of a volatile memory device includes a dynamic random-access memory (DRAM) device. An example of a non-volatile memory device includes a flash memory device (e.g., a flash memory stick). A memory device usually has numerous memory cells to store information. In a volatile memory device, information stored in the memory cells are lost if supply power is disconnected from the memory device. In a non-volatile memory device, information stored in the memory cells are retained even if supply power is disconnected from the memory device.

The description herein involves volatile memory devices. Most conventional volatile memory devices store information in the form of charge in a capacitor structure included in the memory cell. As demand for device storage density increases, many conventional techniques provide ways to shrink the size of the memory cell in order to increase device storage density for a given device area. However, physical limitations and fabrication constraints may pose a challenge to such conventional techniques if the memory cell size is to be shrunk to a certain dimension. Unlike some conventional memory devices, the memory devices described herein include features that can overcome challenges faced by conventional techniques.

BRIEF DESCRIPTION OF THE DRAWINGS

FIGS. 5A-5C are layout diagrams of two more memory cells, according to some embodiments described herein.

DETAILED DESCRIPTION

The memory device described herein includes volatile memory cells having a charge storage node (e.g., structure) that can be a floating gate structure. Each of the described memory cells can include two transistors (2T memory cell). One of the two transistors is a charge storage transistor having the charge storage structure of the memory cell (such as, for example, a floating gate of a floating gate memory cell, or a charge trap structure of a charge trap memory cell). The memory device described herein can have structure that allow the size of the memory device to be relatively smaller than the size of similar conventional memory devices. Different variations of the described memory device are discussed in detail below with reference to FIG. 1 through FIG. 8.

Figure 1:
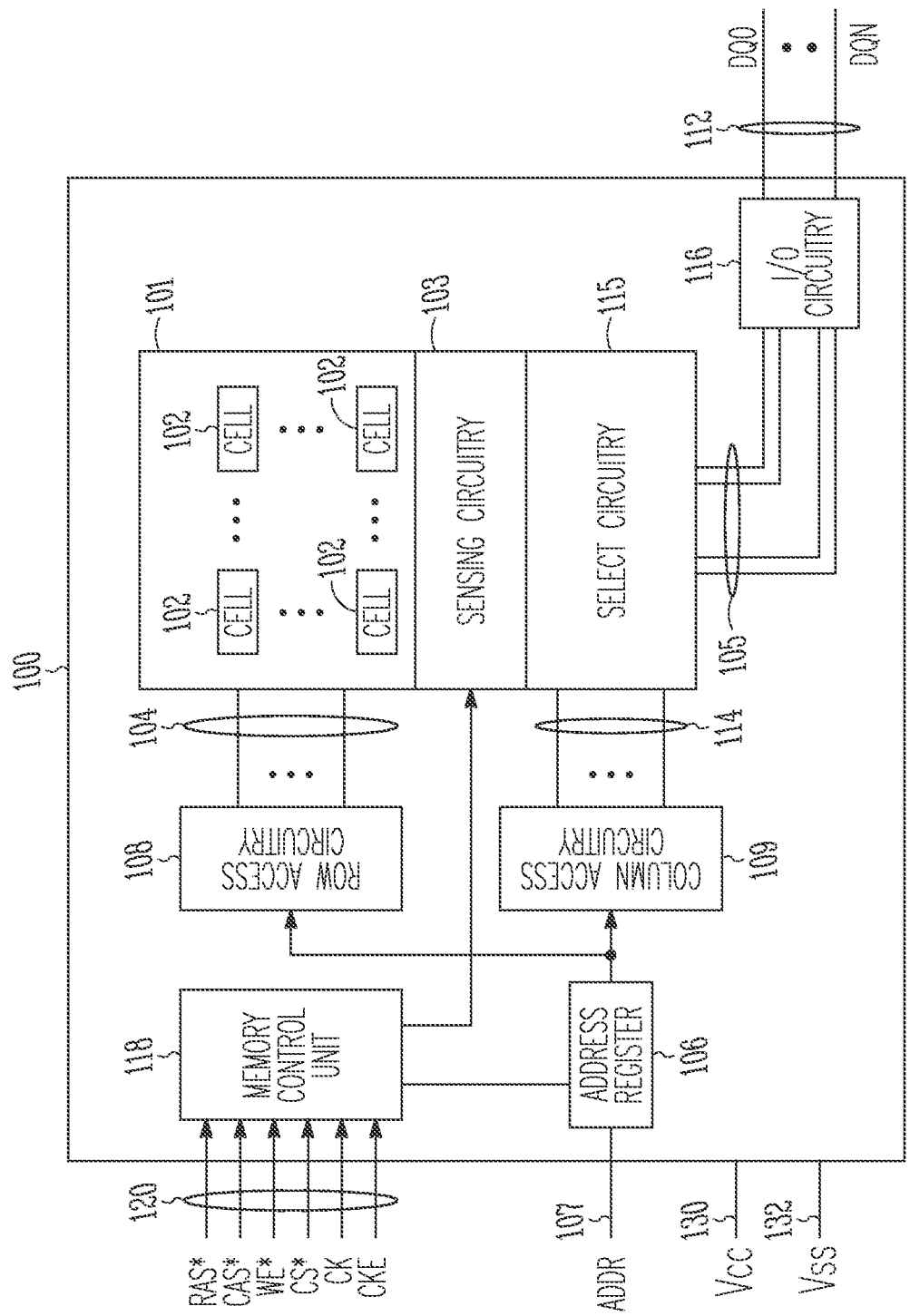
FIG. 1 shows a block diagram of an apparatus in the form of a memory device including volatile memory cells, according to some embodiments described herein.

FIG. 1 shows a block diagram of an apparatus in the form of a memory device 100 including volatile memory cells, according to some embodiments described herein. Memory device 100 includes a memory array 101, which can contain memory cells 102. Memory device 100 is volatile memory device (e.g., a DRAM device), such that memory cells 102 are volatile memory cells. Thus, information stored in memory cells 102 may be lost (e.g., invalid) if supply power (e.g., supply voltage Vcc) is disconnected from memory device 100. Hereinafter, Vcc is referred to represent some voltage levels, however, they are not limited to a supply voltage (e.g., Vcc) of the memory device (e.g., memory device 100). For example, if the memory device (e.g., memory device 100) has an internal voltage generator (not shown in FIG. 1) that generates an internal voltage based on Vcc, such an internal voltage may be used instead of Vcc.

In a physical structure of memory device 100, memory cells 102 can be formed vertically (e.g., stacked over each other in different layers) in different multiple levels or decks over a substrate (e.g., semiconductor substrate) of memory device 100. The structure of memory array 101 including memory cells 102 can include the structure of memory arrays and memory cells described below with reference to FIG. 2 through FIG. 7.

As shown in FIG. 1, memory device 100 can include access lines 104 (e.g., "word lines") and data lines (e.g., bit lines) 105. Memory device 100 can use signals (e.g., word line signals) on access lines 104 to access memory cells 102 and data lines 105 to provide information (e.g., data) to be stored in (e.g., written) or sensed (e.g., read) from memory cells 102.

Memory device 100 can include an address register 106 to receive address information ADDR (e.g., row address signals and column address signals) on lines (e.g., address lines) 107. Memory device 100 can include row access circuitry (e.g., X-decoder) 108 and column access circuitry (e.g., Y-decoder) 109 that can operate to decode address information ADDR from address register 106. Based on decoded address information, memory device 100 can determine which memory cells 102 are to be accessed during a memory operation. Memory device 100 can perform a write operation to store information in memory cells 102, and a read operation to read (e.g., sense) information (e.g., previously stored information) in memory cells 102. Memory device 100 can also perform an operation (e.g., a refresh operation) to refresh (e.g., to keep valid) the value of information stored in memory cells 102. Each of memory cells 102 can be configured to store information that can represent at most one bit (e.g., a single bit having a binary 0 ("0") or a binary 1 ("1"), or more than one bit (e.g., multiple bits having a combination of at least two binary bits).

Memory device 100 can receive a supply voltage, including supply voltages Vcc and Vss, on lines 130 and 132, respectively. Supply voltage Vss can operate at a ground potential (e.g., having a value of approximately zero volts). Supply voltage Vcc can include an external voltage supplied to memory device 100 from an external power source such as a battery or an alternating current to direct current (AC-DC) converter circuitry.

As shown in FIG. 1, memory device 100 can include a memory control unit 118 to control memory operations (e.g., read and write operations) of memory device 100 based on control signals on lines (e.g., control lines) 120. Examples of signals on lines 120 include a row access strobe signal RAS*, a column access strobe signal CAS*, a write-enable signal WE*, a chip select signal CS*, a clock signal CK, and a clock-enable signal CKE. These signals can be part of signals provided to a DRAM device.

As shown in FIG. 1, memory device 100 can include lines (e.g., global data lines) 112 that can carry signals DQ0 through DQN. In a read operation, the value (e.g., "0" or "1") of information (read from memory cells 102) provided to lines 112 (in the form signals DQ0 through DQN) can be based on the values of the signals on data lines 105. In a write operation, the value (e.g., "0" or "1") of the information provided to data lines 105 (to be stored in memory cells 102) can be based on the values of signals DQ0 through DQN on lines 112.

Memory device 100 can include sensing circuitry 103, select circuitry 115, and input/output (I/O) circuitry 116. Column access circuitry 109 can selectively activate signals on lines (e.g., select lines) based on address signals ADDR. Select circuitry 115 can respond to the signals on lines 114 to select signals on data lines 105. The signals on data lines 105 can represent the values of information to be stored in memory cells 102 (e.g., during a write operation) or the values of information read (e.g., sensed) from memory cells 102 (e.g., during a read operation).

I/O circuitry 116 can operate to provide information read from memory cells 102 to lines 112 (e.g., during a read operation) and to provide information from lines 112 (e.g., provided by an external device) to data lines 105 to be stored in memory cells 102 (e.g., during a write operation). Lines 112 can include nodes within memory device 100 or pins (or solder balls) on a package where memory device 100 can reside. Other devices external to memory device 100 (e.g., a memory controller or a processor) can communicate with memory device 100 through lines 107, 112, and 120.

Memory device 100 may include other components, which are not shown to help focus on the embodiments described herein. Memory device 100 can be configured to include at least a portion of the memory device with associated structures and operations described below with reference to FIG. 2 through FIG. 6.

One of ordinary skill in the art may recognize that memory device 100 may include other components, several of which are not shown in FIG. 1 so as not to obscure the example embodiments described herein. At least a portion of memory device 100 (e.g., a portion of memory array 101) can include structures similar to or identical to any of the memory devices described below with reference to FIG. 2.

Figure 2:
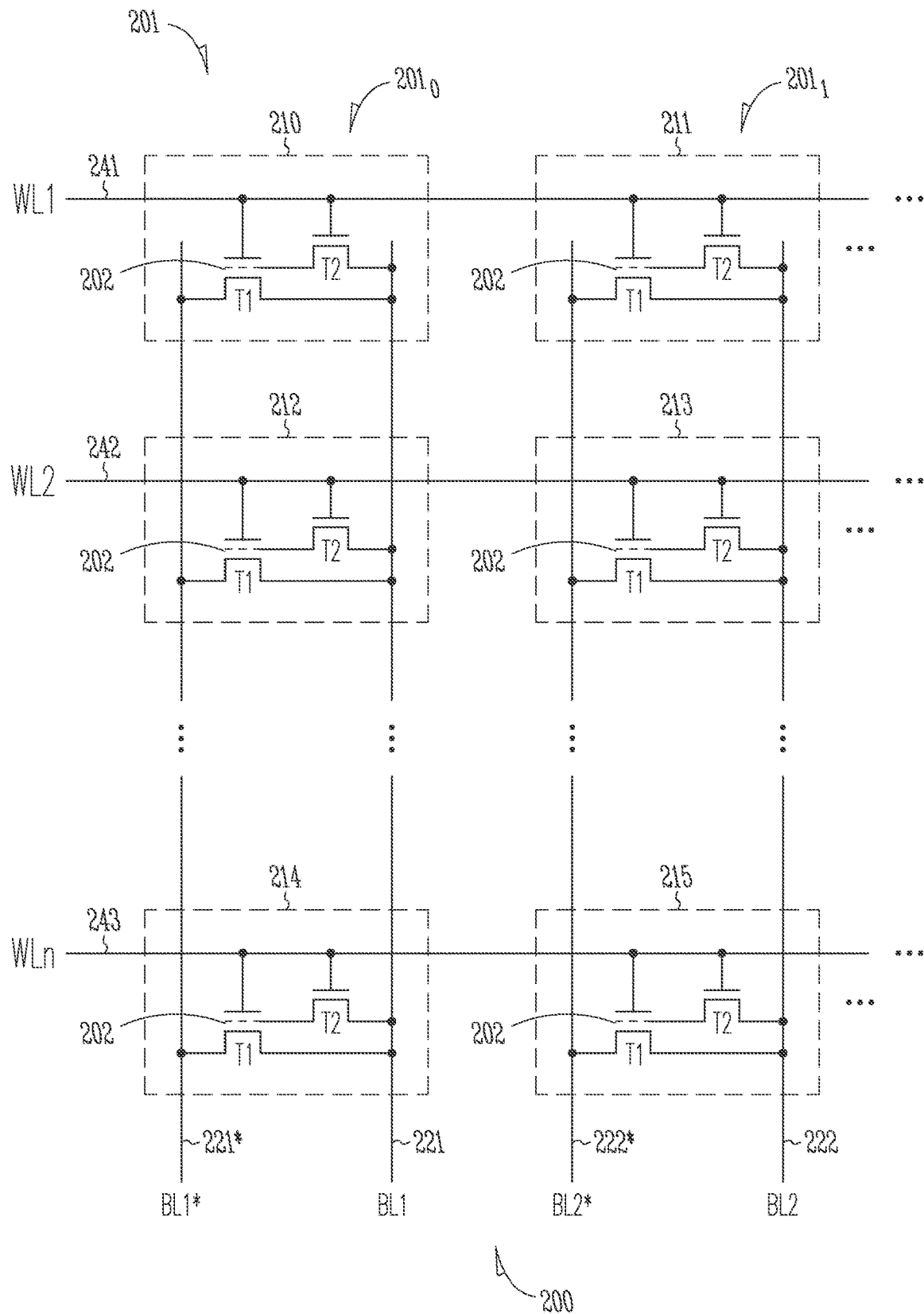
FIG. 2 is a schematic diagram of a portion of a memory device including a memory array, according to some embodiments described herein.

FIG. 2 shows a schematic diagram of a portion of a memory device 200 including a memory array 201, according to some embodiments described herein. Memory device 200 can correspond to one or more portions of memory device 100 of FIG. 1. For example, memory array 201 can form part of memory array 101 of FIG. 1. As shown in FIG. 2, memory device 200 can include memory cells 210 through 215, which are volatile memory cells (e.g., DRAM cells). For simplicity, similar or identical elements among memory cells 210 through 215 are given the same labels.

Each of memory cells 210 through 215 can include two transistors T1 and T2. Thus, each of memory cells 210 through 215 can be called a 2T (two-transistor) memory cell. Each of transistors T1 and T2 can include a field-effect transistor (FET). Transistor T1 can include a floating-gate based transistor. Each of memory cells 210 through 215 can include a charge storage node 202, which can include the floating gate (e.g., floating gate 202) of transistor T1. Charge storage node 202 can store charge. Charge storage node 202 is the memory element of a respective memory cell among memory cells 210 through 215. The value (e.g., "0" or "1") of information stored in a particular memory cell among memory cells 210 through 215 can be based on the amount of charge in charge storage node 202 of that particular memory cell. As shown in FIG. 2, a non-gate terminal (e.g., source or drain) of transistor T2 of a particular memory cell among memory cells 210 through 215 can be directly coupled to (e.g., electrically in contact with) charge storage node 202 of that particular memory cell.

Memory cells 210 through 215 can be arranged in memory cell groups (e.g., strings) $201_0$ and $201_1$. FIG. 2 shows two memory cell groups (e.g., $201_0$ and $201_1$) as an example. However, memory device 200 can include more than two memory cell groups. Memory cell groups $201_0$ and $201_1$ can include the same number of memory cells. For example, memory cell group $201_0$ can include memory cells 210, 212, and 214, and memory cell group $201_1$ can include memory cells 211, 213, and 215. FIG. 2 shows three memory cells in each of memory cell groups $201_0$ and $201_1$ as an example. The number of memory cells in memory cell groups $201_0$ and $201_1$ can be different from three.

Memory device 200 can perform a write operation to store information in memory cells 210 through 215, and a read operation to read (e.g., sense) information from memory cells 210 through 215. Each of memory cells 210 through 215 can be randomly selected during a read or write operation. Thus, memory device 200 can be called a dynamic random-access memory device (DRAM). Unlike some conventional DRAM devices that store information in a structure such as a capacitor, memory device 200 can store information in the form of charge in charge storage node 202. As mentioned above, charge storage node 202 can be the floating gate of transistor T1. Thus, memory device 200 can also be called a floating-gate based DRAM device. Notably, the memory cells do not include a separate charge storage container (e.g., capacitor) to store charge.

Memory device 200 can include access lines (e.g., word lines) 241, 242, and 243 that can carry respective signals (e.g., word line signals) WL1, WL2, and WL3. Access lines 241, 242, and 243 can be shared between memory cell groups $201_0$ and $201_1$. Access lines 241, 242, and 243 can be selectively activated (e.g., activated one at a time) during an operation (e.g., read or write operation) of memory device 200 to access a selected memory cell (or selected memory cells) among memory cells 210 through 215. A selected cell can be referred to as a target cell. In a read operation, information can be read from a selected memory cell (or selected memory cells). In a write operation, information can be stored information in a selected memory cell (or selected memory cells).

In memory device 200, a single access line (e.g., a single word line) can be used to control (e.g., turn on or turn off) transistors T1 and T2 of a respective memory cell during either a read or write operation of memory device 200. Some conventional memory devices may use multiple (e.g., two separate) access lines to control access to a respective memory cell during read and write operations. In comparison with such conventional memory devices (that use multiple access lines for the same memory cell), using a single access line in memory device 200 to control access to a respective memory cell (e.g., to control both transistors T1 and T2) can save space and simplify operation of memory device 200.

In memory device 200, the gate of each of transistors T1 and T2 can be part of a respective access line (e.g., a respective word line). For example, the gate of each of transistors T1 and T2 of memory cells 210 and 221 can be part of access line 241. The gate of each of transistors T1 and T2 of memory cells 212 and 213 can be part of access line 242. The gate of each of transistors T1 and T2 of memory cells 214 and 215 can be part of access line 243.

As shown in FIG. 2, memory device 200 can include data lines (e.g., bit lines) 221, 221', 222, and 222' that can carry respective signals (e.g., bit line signals) BL1, BL1*, BL2, and BL2*. During a read operation, memory device 200 can use data lines 221 and 221' to read information from a selected memory cell of memory cell group $201_0$, and data lines 222 and 222' to read information from a selected memory cell of memory cell group $201_1$. During a write operation, memory device 200 can use data line 221 to store information in a selected memory cell of memory cell group $201_0$, and data line 222 to store information in a selected memory cell of memory cell group $201_1$.

Transistor T1 includes a channel portion between the source and drain (e.g., non-gate terminals) of transistor T1. Transistor T2 includes a channel portion between the source and drain (e.g., non-gate terminals) of transistor T2. The two channel portions of respective transistors T1 and T2 can be controlled by the same access line (e.g., by a single word line), such as one of access lines 241, 242, and 243. The channel portion of transistor T2 can be formed from a material or a combination of materials (e.g., a high band-gap material) that can provide a relatively low leakage between charge storage node 202 of a respective memory cell and data line 221 or 222. Such a low leakage can improve accuracy of information read from a selected memory cell and can improve the retention of information stored in the selected memory cell.

Memory device 200 can include read paths (e.g., circuit paths). Information read from a selected memory cell during a read operation can be obtained through a read path coupled to the selected memory cell. In memory cell group $201_0$, a read path of a particular memory cell (e.g., 210, 212, or 214) can include transistor T1 (e.g., can include a read current path through the source, drain, and channel portion of transistor T1) of that particular memory cell and data lines 221 and 221'. In memory cell group $201_1$, a read path of a particular memory cell (e.g., 221, 213, or 215) can include transistor T1 (e.g., can include a read current path through the source, drain, and channel portion of transistor T1) of that particular memory cell and data lines 222 and 222'. Since transistor T1 can be used in a read path to read information from the respective memory cell during a read operation, transistor T1 can be called a read transistor.

Memory device 200 can include write paths (e.g., circuit paths). Information to be stored in a selected memory cell during a write operation can be provided to the selected memory cell through a write path coupled to the selected memory cell. In memory cell group $201_0$, a write path of a particular memory cell can include transistor T2 (e.g., can include a write current path through the source, drain, and channel portion of transistor T2) of that particular memory cell and data line 221. In memory cell group $201_1$, a write path of a particular memory cell (e.g., 221, 213, or 215) can include transistor T2 (e.g., can include a write current path through the source, drain, and channel portion of transistor T2) of that particular memory cell and data line 222. Since transistor T2 can be used in a write path to store information in a respective memory cell during a write operation, transistor T2 can be called a write transistor.

Each of transistors T1 and T2 can have a threshold voltage (Vt). Transistor T1 has a threshold voltage Vt1. Transistor T2 has a threshold voltage Vt2. The value of threshold voltage Vt2 can be greater than the value of threshold voltage Vt1. The difference in values of threshold voltages Vt1 and Vt2 allows reading (e.g., sensing) of information stored in charge storage node 202 in transistor T1 on the read path without affecting (e.g., without turning on) transistor T2 on the write path (e.g., path through transistor T2). This can prevent leaking of charge from charge storage node 202 to the write path.

In a structure of memory device 200, transistor T1 can be formed (e.g., engineered) such that threshold voltage Vt1 of transistor T1 can be less than zero volts (e.g., Vt1<0V) regardless of the value information stored charge storage node 202 of transistor T1 (e.g., regardless of the state (e.g., "0" or "1") of charge storage node 202). Thus, in this structure, the relationship between the values of threshold voltages Vt1 and Vt2 can be express as follows, Vt1 for state "0"<Vt1 for state "1"<0V and Vt2=0V (or alternatively Vt2>0V).

In an alternative structure of memory device 200, transistor T1 can be formed (e.g., engineered) such that threshold voltage Vt1 of transistor T1 can be less than zero volts if information stored in memory cell 210 through 215 has one value corresponding to a particular state (e.g., Vt1<0V (or alternatively Vt1=0V) for state "0"), and such that threshold voltage Vt1 of transistor T1 can be greater than zero volts if information stored in memory cell 210 through 215 has another value corresponding to another particular state (e.g., Vt1>0V for state "1", and Vt2>Vt1). Thus, in the alternative structure, the relationship between the values of threshold voltages Vt1 and Vt2 can be express as follows, Vt1 for state "0"<Vt1 for state "1"<Vt2, where Vt1 for state "0"<0V (or alternatively Vt1 for state "0"=0V) and Vt1 for state "1">0V.

In another alternative structure, transistor T1 can be formed (e.g., engineered) such that threshold voltage Vt1 of transistor T1 can be at least zero volts (e.g., Vt1=0 or Vt1>0V) regardless of the information stored in charge storage node 202 of transistor T1 (e.g., regardless of the state (e.g., "0" or "1") of charge storage node 202). Thus, in this alternative structure, the relationship between the values of threshold voltages Vt1 and Vt2 can be express as follows, Vt1 (for state "0")<Vt1 (for state "1")<Vt2, where Vt1 for state "0"=0V (or alternatively Vt1 for state "0">0V.

During read operation of memory device 200, only one memory cell of the same memory cell group can be selected one at a time to read information from the selected memory cell. For example, only memory cell 210, 212, or 214 of memory cell groups $201_0$ can be selected at a time during a read operation to read information from the selected memory cell (e.g., memory cell 210, 212, or 214 in this example). In another example, only memory cell 221, 213, or 215 of memory cell groups $201_1$ can be selected one at a time during a read operation to read information from the selected memory cell (e.g., memory cell 221, 213, or 215 in this example).

During read operation, memory cells of different memory cell groups (e.g., memory cell groups $201_0$ and $201_1$) that share the same access line (e.g., word line 241, 242, or 243) can be concurrently selected (or alternatively can be sequentially selected). For example, memory cells 210 and 221 can be concurrently selected during a read operation to read (e.g., concurrently read) information from memory cells 210 and 221. Memory cells 212 and 213 can be concurrently selected during a read operation to read (e.g., concurrently read) information from memory cells 212 and 213. Memory cells 214 and 215 can be concurrently selected during a read operation to read (e.g., concurrently read) information from memory cells 214 and 215.

The value of information read from the selected memory cell of memory cell group $201_0$ during a read operation can be determined based on the value of a current detected (e.g. sensed) from a read path (described above) that includes transistor T1 of the selected memory cell (e.g., memory cell 210, 212, or 214) and data lines 221 and 221'. The value of information read from the selected memory cell of memory cell group $201_1$ during a read operation can be determined based on the value of a current detected (e.g. sensed) from a read path that includes transistor T1 of the selected memory cell (e.g., memory cell 221, 213, or 215) and data lines 222 and 222'.

Memory device 200 can include detection circuitry (not shown) that can operate during a read operation to detect (e.g., sense) a current (e.g., I1, not shown) on a read path that includes data lines 221 and 221' and a current (e.g., I2, not shown) on a read path that includes data lines 222 and 222'. The value of the detected current can be based on the value of information stored in the selected memory cell. For example, depending on the value of information stored in the selected memory cell of memory cell group $201_0$, the value of the detected current (e.g., the value of I1) between data lines 221 and 221' can be zero or greater than zero. Similarly, depending on the value of information stored in the selected memory cell of memory cell group $201_1$, the value of the detected current (e.g., the value of I2) between data lines 222 and 222' can be zero or greater than zero. Memory device 200 can include circuitry (not shown) to translate the value of detected current into the value (e.g., "0", "1", or a combination of multi-bit values) of information stored in the selected memory cell.

During write operation of memory device 200, only one memory cell of the same memory cell group can be selected one at a time to store information in the selected memory cell. For example, only memory cell 210, 212, or 214 of memory cell groups $201_0$ can be selected one at a time during a write operation to store information in the selected memory cell (e.g., memory cell 210, 212, or 214 in this example). In another example, only memory cell 221, 213, or 215 of memory cell groups $201_1$ can be selected one at a time during a write operation to store information in the selected memory cell (e.g., memory cell 221, 213, or 215 in this example).

During write operation, memory cells of different memory cell groups (e.g., memory cell groups $201_0$ and $201_1$) that share the same access line (e.g., word line 241, 242, or 243) can be concurrently selected. For example, memory cells 210 and 221 can be concurrently selected during a write operation, operation to store (e.g., concurrently store) information in memory cells 210 and 221. Memory cells 212 and 213 can be concurrently selected during a write operation to store (e.g., concurrently store) information in memory cells 212 and 213. Memory cells 214 and 215 can be concurrently selected during a write operation to store (e.g., concurrently store) information in memory cells 214 and 215.

Information to be stored in a selected memory cell of memory cell group $201_0$ during a write operation can be provided through a write path (describe above) that includes data line 221 and transistor T2 of the selected memory cell (e.g., memory cell 210, 212, or 214). Information to be stored in a selected memory cell of memory cell group $201_1$ during a write operation can be provided through a write path (described above) that includes data line 222 and transistor T2 of the selected memory cell (e.g., memory cell 221, 213, or 215). As described above, the value (e.g., binary value) of information stored in a particular memory cell among memory cells 210 through 215 can be based on the amount of charge in charge storage node 202 of that particular memory cell.

In a write operation, the amount of charge in charge storage node 202 of a selected memory cell can be changed (to reflect the value of information stored in the selected memory cell) by applying a voltage on a write path that includes transistor T2 of that particular memory cell and the data line (e.g., data line 221 or 222) coupled to that particular memory cell. For example, a voltage having one value (e.g., 0V) can be applied on data line 221 (e.g., provide 0V to signal BL1) if information to be stored in a selected memory cell among memory cells 210, 212, and 214 has one value (e.g., "0"). In another example, a voltage having another value (e.g., a positive voltage) can be applied on data line 221 (e.g., provide a positive voltage to signal BL1) if information to be stored in a selected memory cell among memory cells 210, 212, and 214 has another value (e.g., "1"). Thus, information can be stored (e.g., directly stored) in charge storage node 202 of a particular memory cell by providing the information (to be stored) through a write path that includes transistor T2 of that particular memory cell and the data line (e.g., data line 221 or 222) coupled to that particular memory cell.

Figure 3:
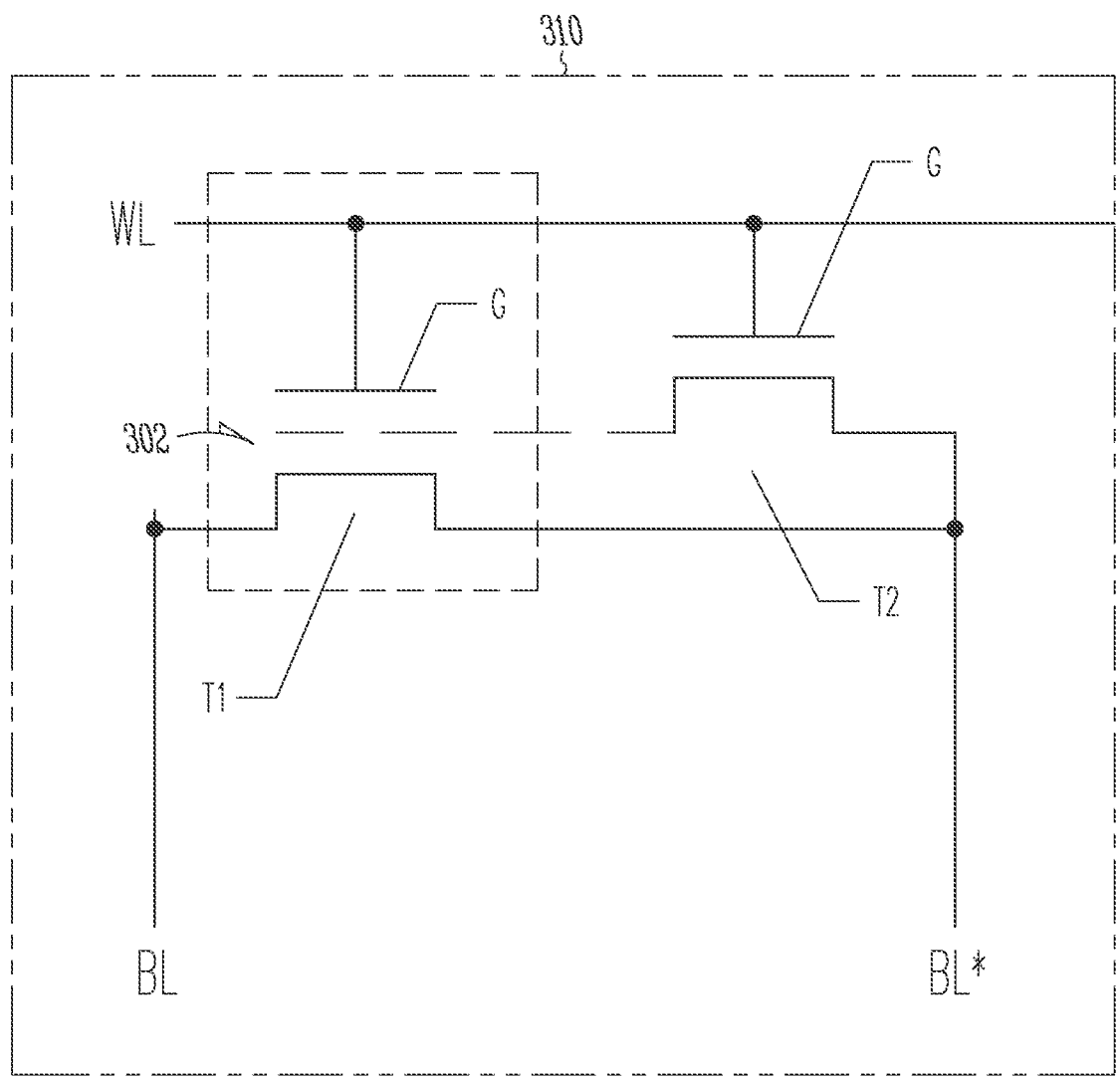
FIG. 3 is schematic diagram of a memory structure of the memory device of FIG. 2, according to some embodiments described herein.

FIG. 3 is a circuit schematic of a memory structure. The memory structure includes a memory cell 310 that can be any of the memory cells in memory device 200 of FIG. 2. As explained above, the memory cell includes two transistors T1 and T2. T1 can be a p-channel field effect transistor (PFET). The source and drain of the PFET are formed in a p-type semiconductor material. (e.g., in a substrate of p-type silicon). An example of semiconductor material is doped silicon. A dopant having five valence electrons such as phosphorous, arsenic, or antimony can be used to increase the electron concentration in the silicon or with a dopant having three valence electrons such as boron, gallium, indium, or aluminum to increase the hole concentration in the silicon. Dopants are typically added in small, controlled quantities to produce the desired hole or electron concentration in the semiconductor material, resulting in n-type material if a surplus of electrons are present, such as in the source and drain, and resulting in p-type material if an excess of holes are present to create a p-type silicon substrate.

Transistor T1 includes a charge storage node 302 indicated by the dashed line below the control gate G of T1. The charge storage node is the memory element of the memory cell. An example of a charge storage node is a floating gate (FG) structure. The floating gate structure that can be fabricated from a conductor such as metal or conductive polysilicon. A dielectric material separates the floating gate from the control gate and the p-type semiconductor material. The control gate can be formed using a similar material as the floating gate. The floating gate is not directly electrically coupled to another conductive element of transistor T1, but is "floating" in the dielectric material. The floating gate structure can be separated from a channel region of the p-type substrate material between the source and the drain by a thin insulative layer of controlled thickness (e.g., ten nanometers). The channel region between the source and drain can be a read channel portion of transistor T1.

T2 can be an n-channel field effect transistor (NFET). The source and drain of the NFET are formed in an n-type semiconductor material (e.g., in a well of n-type silicon). The channel region between the source and drain of the NFET can be a write channel portion of T2. Therefore, the read channel region and the write channel region can be complementary. The n-type semiconductor material can have a high bandgap (e.g., n-type gallium phosphide or GaP) so that transistor T2 is a low leakage transistor. Transistor T2 is designed (e.g., by doping geometry) to have a high threshold voltage Vt while transistor T1 is designed to have a low Vt. In certain embodiments, the write channel region can include semiconducting oxide materials, transparent conductive oxide materials, and other oxide materials. In variations, the write channel region may comprise an oxide semiconductor material, such as one or more of zinc tin oxide (ZTO), indium zinc oxide (IZO), zinc oxide (ZnOx), indium gallium zinc oxide (IGZO), indium gallium silicon oxide (IGSO), indium oxide (InOx, In2O3), tin oxide (SnO2), titanium oxide (TiOx), zinc oxide nitride (ZnxOyNz), magnesium zinc oxide (MgxZnyOz), indium zinc oxide (InxZnyOz), indium gallium zinc oxide (InxGayZnzOa), zirconium indium zinc oxide (ZrxInyZnzOa), hafnium indium zinc oxide (HfxInyZnzOa), tin indium zinc oxide (SnxInyZnzOa), aluminum tin indium zinc oxide (AlxSnyInzZnaOd), silicon indium zinc oxide (SixInyZnzOa), zinc tin oxide (ZnxSnyOz), aluminum zinc tin oxide (AlxZnySnzOa), gallium zinc tin oxide (GaxZnySnzOa), zirconium zinc tin oxide (ZrxZnySnzOa), and indium gallium silicon oxide (InGaSiO).

As indicated by the dashed line in FIG. 3, the write channel portion of NFET T1 is directly coupled to the charge storage node of PFET T2. The charge storage node can be directly written using low leakage transistor T2 as a 'write' transistor.

The memory cell 310 includes a single bit line pair BL and BL*. The bit lines of the bit line pair are coupled to the read channel portion of PFET T1. One of the bit lines BL is coupled to the write channel portion. The memory cell 310 also includes a single word line WL (or single access line). The single access line may overlap at least part of each of the read channel portion of PFET T1 and the write channel portion of NFET T2. An insulative material (e.g., an oxide material) is arranged between the access line and the channel portions to isolate the access line. One access line is used to activate both the read channel portion of T1 and the write channel portion of T2. The read channel and the write channel also share a bit line. Because the read channel is included in the PFET and the write channel is included in the NFET, the difference in threshold voltage Vt between the read transistor T1 and the write transistor T2 enables reading the charge storage node without turning on the write node connected to the write bit line BL.

Figure 4A:
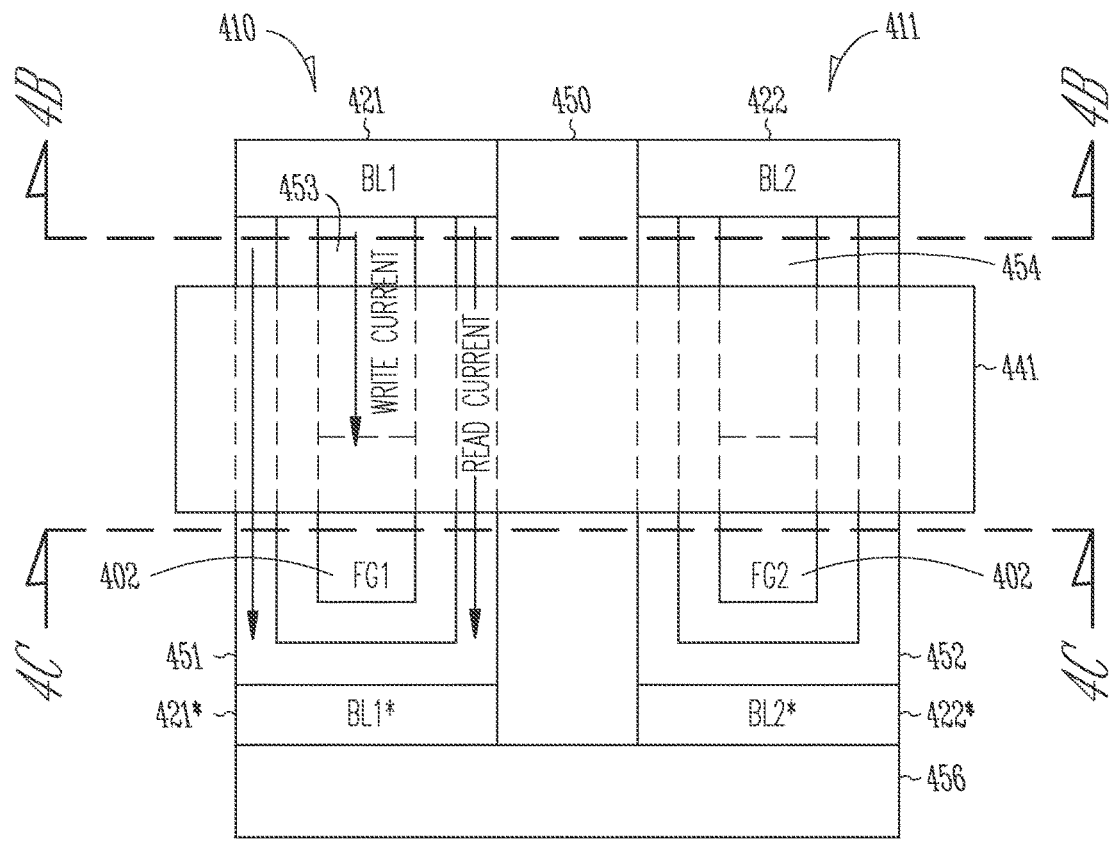
FIGS. 4A-4C are layout diagrams of two memory cells, according to some embodiments described herein.
Figure 4B:
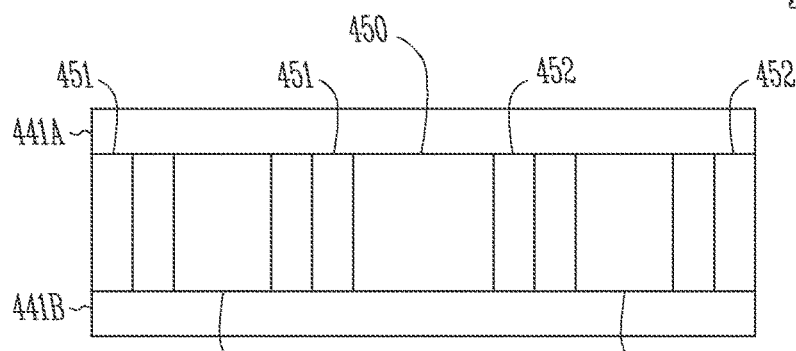
Figure 4C:
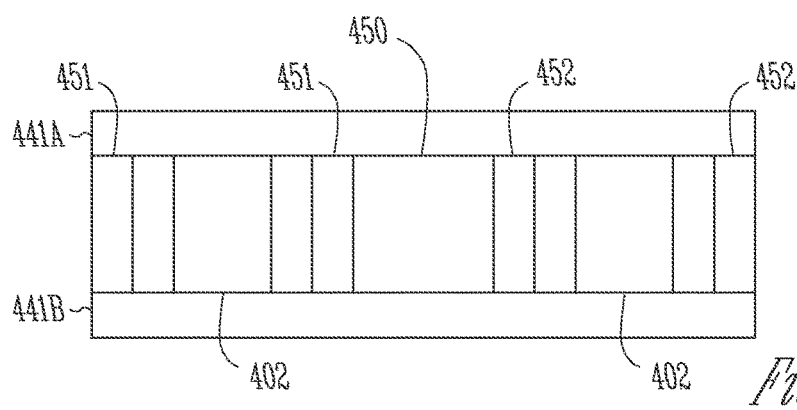

FIGS. 4A-4C are layout diagrams of two memory cells 410 and 411. The memory cells can be any of the memory cells in memory device 200 of FIG. 2, such as memory cells 210 and 211 for example. As shown in FIG. 4A, the memory cells can be separated by a dielectric material 450. Both memory cells are 2T memory cells comprised of a read transistor T1 and a write transistor T2. The T1 transistor of both memory cells includes a floating gate structure 402, labeled FG1 and FG2.

Both memory cells include a read channel portion 451, 452, and a write channel portion 453, 454. The write channel portions 453, 454 are shown directly contacting the floating gates FG1, FG2. Because the T1 transistor is a PFET, the conduction in the read channel is hole conduction for a read operation. Because the T2 transistor is an NFET, the conduction in the write channel is electron conduction for a write operation.

The read channel portions 451, 452 in the embodiment of FIG. 4A are two-sided read channels with one side on each side of the floating gate structure 402. A first channel portion is arranged adjacent to a first surface of the floating gate structure 402, and a second channel portion is arranged adjacent to a second surface of the floating gate structure 402. The two channel portions are arranged on opposite surfaces of the floating gate structure 402. Read channel portions 451, 452 are separated from the floating gate structure 402 with an insulator material (e.g., silicon oxide (SiO2), hafnium oxide (HfO2), aluminum oxide ($Al_2O_3$), etc.)

The read channel of memory cell 410 is contacted by bit line pair 421, 421*. The read channel of memory cell 411 is contacted by bit line pair 422, 422*. The bit lines extend orthogonal to the plane of the page of FIG. 4A. Write bit lines 421 and 422 are shown contacting the write channel portions 453, 454. The high bandgap n-type material of the T2 transistor provides low leakage between the floating gate structure and the write bit line BL.

FIG. 4A also shows access line 441 and substrate 456. Memory cells 410, 411 are arranged above the substrate 456. The access line 441 extends in a direction horizontal to the substrate 456, and overlaps a portion of the floating gate structures 402, the write channels 453, 454, and the read channels 451, 452. In some embodiments, the access line 441 does not overlap a portion of the floating gate structures 402, and the bottom of the access line 441 can be higher than the top of the floating gate structure 402. The floating gate structures 402 extend closer to the substrate 456 than the access line 441. Because the one access line overlaps the write channels 453, 454, and the read channels 451, 452, the one access line 441 can be used to activate both the write channel and the read channel of a memory cell. The Read channel portions 451, 452 are separated from the access line by an insulator material. The insulator material may be the same or different from the insulator material separating the read channel portions 451, 452 from the floating gate structure 402. The insulator material may have the same or different thickness than the insulator material separating the read channel portions 451, 452 from the floating gate structure 402. The material for the access line 441 may be the same or different from the material of the floating gate structure 402.

FIG. 4B is the view along A-A' in FIG. 4A looking toward the access line. FIG. 4C is the view along B-B' in FIG. 4A looking toward the access line. As shown in FIGS. 4B and 4C, the single access line 441 can be a two-sided access line. The access line 441 can include a first access line portion 441A arranged adjacent to a first side (e.g., a back side) of the floating gate structure 402, and a second access line 441B portion arranged adjacent to a second side (e.g., a front side) of the floating gate structure 402. As shown in FIG. 4B, the second side of the access line can be opposite the first side with the floating gate structure between the two portions.

The layout of the memory cell shown in FIGS. 4A-4C show that although the cell is described as a two-transistor or 2T memory cell, the memory cell can be implemented as a single read-write gain cell with an effective area of only one transistor and the processing equivalent to only one transistor.

FIGS. 5A-5C are layout diagrams of two more memory cells 510 and 511. The memory cells can be any of the memory cells in memory device 200 of FIG. 2, such as memory cells 210 and 211 for example. As in the example of FIGS. 4A-4C, the memory cells are arranged above a substrate 556 and separated by a dielectric material 550. Both memory cells are 2T memory cells comprised of a read PFET T1 and a write NFET T2. The T1 transistor of both memory cells includes a floating gate structure 502. The T2 transistor is a low leakage transistor comprised of a high bandgap n-type semiconductor material. As shown in FIG. 5A, both memory cells include a read channel portion 551, 552, and a write channel portion 553, 554. The write channel portions 553, 554 are shown directly contacting the floating gate structures FG1, FG2.

The read channel of memory cell 510 is contacted by bit line pair 521, 521*. The read channel of memory cell 511 is contacted by bit line pair 522, 522*. In FIG. 5A, write bit lines 521 and 522 are shown contacting the write channel portions 553, 554. One access line 541 overlaps both the write channel portions 553, 554 and read channel portions 551, 552 of the memory cells.

The difference from the memory cells of FIGS. 4A-4C is that the read channel of the memory cells in FIGS. 5A-5C is a one-sided read channel. For example, the read channel portion 551 of memory cell 510 is arranged adjacent to a first surface of the floating gate structure 502 of the memory cell. Each of the memory cells also includes a metal shield 557, 558. Each of the metal shields is arranged adjacent to a second surface of floating gate structure 502. The metal shields extend in a direction orthogonal to the substrate 556. In the embodiment of FIG. 5A, the read channel portions 551, 552 are arranged nearer the dielectric material 550, and the metal shields are arranged on an opposite of the floating gate structures from the read channel portions.

FIG. 5B is the view along A-A' in FIG. 5A looking toward the access line. FIG. 5C is the view along B-B' in FIG. 5A looking toward the access line. As shown in FIGS. 5B and 5C, read channel is a one-sided read channel, and the single access line 541 can be a two-sided access line including a first access line portion 541A and a second access line 541B portion.

Figure 6:
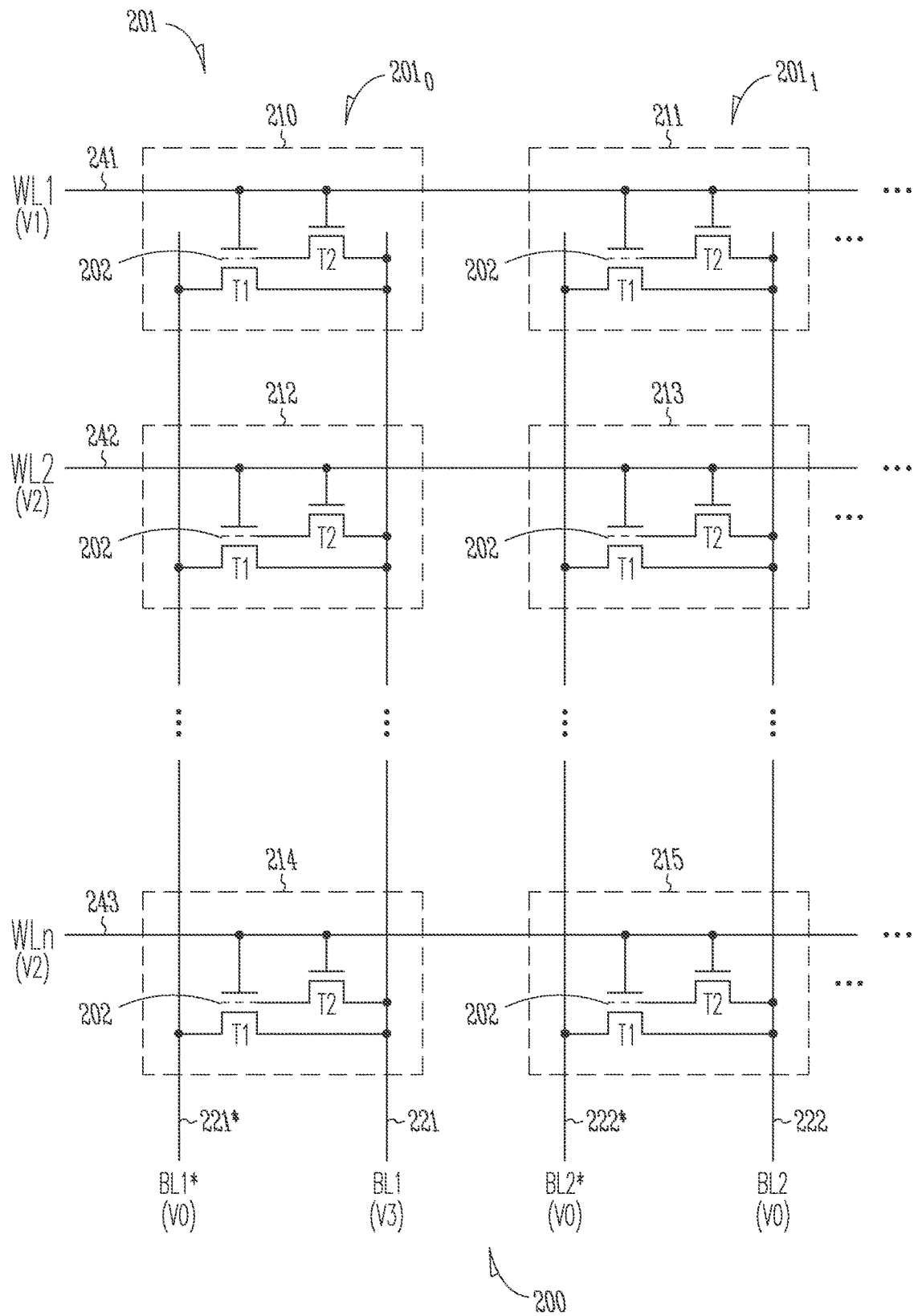
FIG. 6 shows the memory device of FIG. 2 including example voltages used during a read operation of the memory device, according to some embodiments described herein.

FIG. 6 shows memory device 200 of FIG. 2 including example voltages V0, V1, V2, and V3 used during a read operation of memory device 200, according to some embodiments described herein. The example of FIG. 6 assumes that memory cell 210 is a selected memory cell (e.g., target memory cell) during a read operation to read (e.g., to sense) information stored (e.g., previously stored) in memory cell 210. Memory cells 221 through 215 are assumed to be unselected memory cells. This means that memory cells 221 through 215 are not accessed and information stored in memory cells 221 through 215 are not read while information is read from memory cell 210 in the example of FIG. 6.

In FIG. 6, voltages V0, V1, V2, and V3 can represent different voltages applied to respective access lines 214, 242, and 243, and data lines 221, 221', 222, and 222' during a read operation of memory device 200. As an example, voltages V0, V1, V2, and V3 can have values of 0V (e.g., ground), −0.3V, −0.75V, and 0.5V, respectively. These values are example values. Different values may be used.

In the read operation shown in FIG. 6, voltage V1 can have a value (voltage value) to turn on transistor T1 of memory cell 210 (a selected memory cell in this example) and turn off (or keep off) transistor T2 of memory cell 210. This allows information to be read from memory cell 210. Voltage V0 and V2 and can have values, such that transistors T1 and T2 of each of memory cells 221 through 215 (unselected memory cells in this example) are turned off (e.g., kept off). Voltage V3 can have a value, such that a current (e.g., read current) may be formed on a read path that include data lines 221 and 221' and transistor T1 of memory cell 210. This allows a detection of current on the read path coupled to memory cell 210. A detection circuitry (not shown) of memory device 200 can operate to translate the value of detected current (during reading of information from a selected memory cell) into the value (e.g., "0", "1", or a combination of multi-bit values) of information read from the selected memory cell. In the example of FIG. 6, the value of detected current on data lines 221 and 221' can be translated into the value of information read from memory cell 210.

In the read operation shown in FIG. 6, the voltages applied to respective access lines 241, 242, and 243 can cause transistors T1 and T2 of each of memory cells 221 through 215, except transistor T1 of memory cell 210, to turn off (or to remain turned off). Transistor T1 of memory cell 210 may or may not turn on, depending on the value of the threshold voltage Vt1 of transistor T1 of memory cell 210. For example, if transistor T1 of each of memory cells (e.g., 210 through 215) of memory device 200 is formed such that Vt1<0V regardless of the value (e.g., the state) of information stored in a respective memory cell 210, then transistor T1 of memory cell 210 in this example can turn on and conduct a current between data lines 221 and 221' (through transistor T1 of memory cell 210). Memory device 200 can determine the value of information stored in memory cell 210 based on the value of the current (e.g., measured by detection circuitry) between read data lines 221 and 221'.

Figure 7:
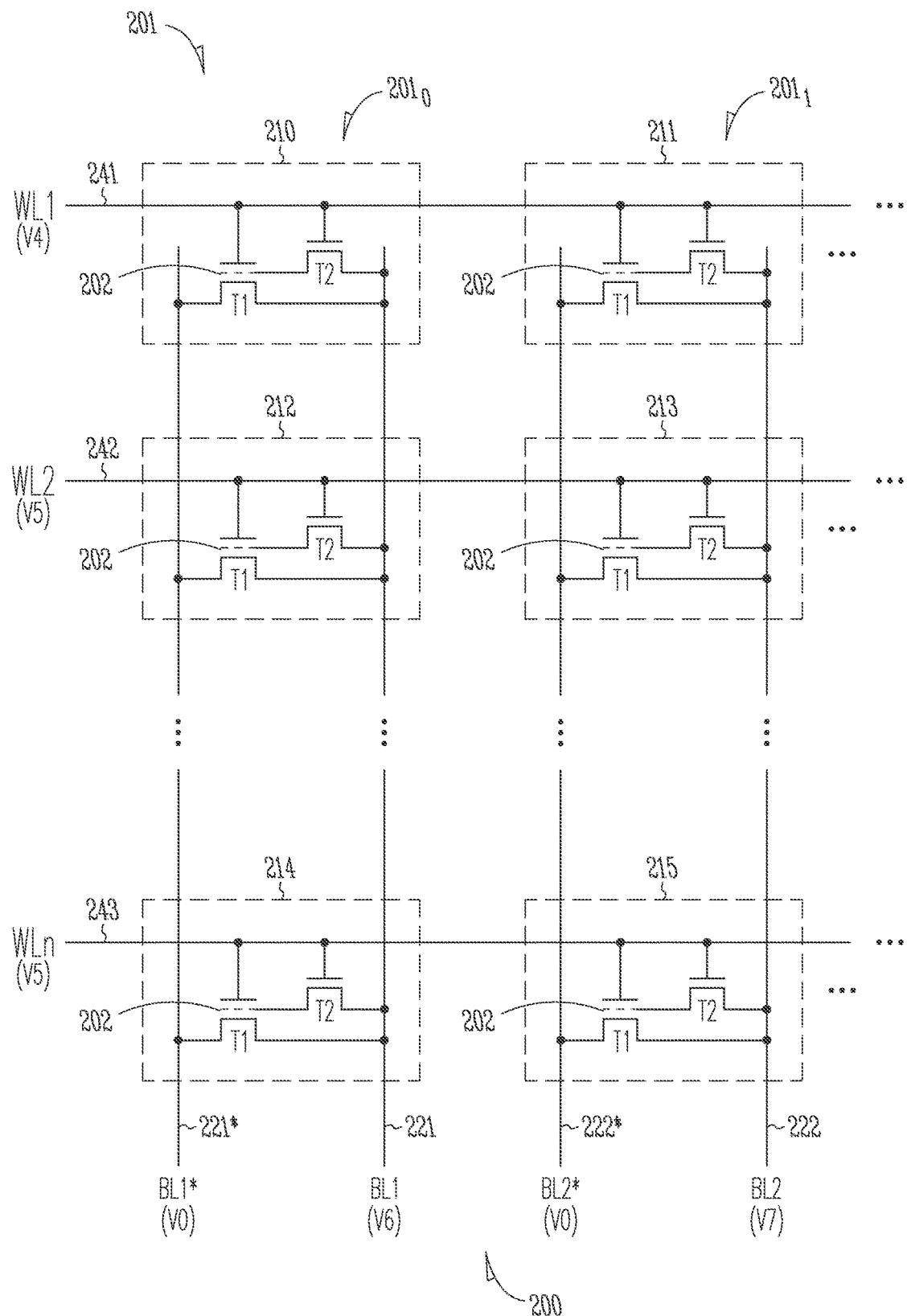
FIG. 7 shows the memory device of FIG. 2 including example voltages used during a write operation of the memory device, according to some embodiments described herein.

FIG. 7 shows memory device 200 of FIG. 2 including example voltages V0, V4, V5, V6, and V7 used during a write operation of memory device 200, according to some embodiments described herein. The example of FIG. 7 assumes that memory cells 210 and 211 are selected memory cell (e.g., target memory cells) during a write operation to store information in memory cells 210 and 211. Memory cells 212 through 215 are assumed to be unselected memory cells. This means that memory cells 212 through 215 are not accessed and information stored is not to be stored in memory cells 212 through 215 while information is stored in memory cells 210 and 211 in the example of FIG. 7.

In FIG. 7, voltages V0, V4, V5, V6, and V7 can represent different voltages applied to respective access lines 214, 242, and 243, and data lines 221, 221', 222, and 222' during a write operation of memory device 200. As an example, voltages V0, V4, and V5 can have values of 0V, 3.3V, and −0.75V. These values are example values. Different values may be used. The values of voltages V6 and V7 can be the same or different depending the value (e.g., "0" or "1") of information to be stored in memory cells 210 and 211. For example, the values of voltages V6 and V7 can be the same if the memory cells 210 and 211 are to store information having the same value (e.g., V6=V7=0V if information to be stored in each memory cell 210 and 211 is "0", and V6=V7=1V to 3V if information to be stored in each memory cell 210 and 211 is "1"). In another example, the values of voltages V6 and V7 can be different (e.g., V6 V7) if the memory cells 210 and 211 are to store information having different values. For example, V6=0V and V7=1V to 3V if "0" to be stored in memory cell 210 and "1" is to be store in memory cell 211). Different values may be used, or V6=1V to 3V and V7=0V if "1" to be stored in memory cell 210 and "0" is to be store in memory cell 211). The range of voltage of 1V to 3V used in the examples here can be other positive values different from the range of 1V to 3V.

In a write operation of memory device 200, voltage V5 can have a value, such that transistors T1 and T2 of each of memory cells 212 through 215 (unselected memory cells in this example) are turned off (e.g., kept off). Voltages V4 can have a value to turn on transistor T2 of each of memory cells 210 and 211 (selected memory cells in this example) and form a write path between charge storage node 202 of memory cell 210 and data line 221 and a write path between charge storage node 202 of memory cell 211 and data line 222. A current (e.g., write current) may be formed between charge storage node 202 of memory cell 210 and data line 221. This current can change the amount of charge on charge storage node 202 of memory device 210 to reflect the value of information to be stored in memory cell 210. Another current (e.g., another write current) may be formed between charge storage node 202 of memory cell 211 and data line 222. This current can change the amount of charge on charge storage node 202 of memory device 211 to reflect the value of information to be stored in memory cell 211.

In the example write operation of FIG. 7, the value of voltage V6 may cause charge storage node 202 of memory cell 210 to discharge or to be charged, such that the resulting charge (e.g., charge remaining after the discharge or charge action) on charge storage node 202 of memory cell 210 can reflect the value of information stored in memory cell 210. Similarly, the value of voltage V7 in this example may cause charge storage node 202 of memory cell 211 to discharge or to be charged, such that the resulting charge (e.g., charge remaining after the discharge or charge action) on charge storage node 202 of memory cell 211 can reflect the value of information stored in memory cell 211.

Figure 8:
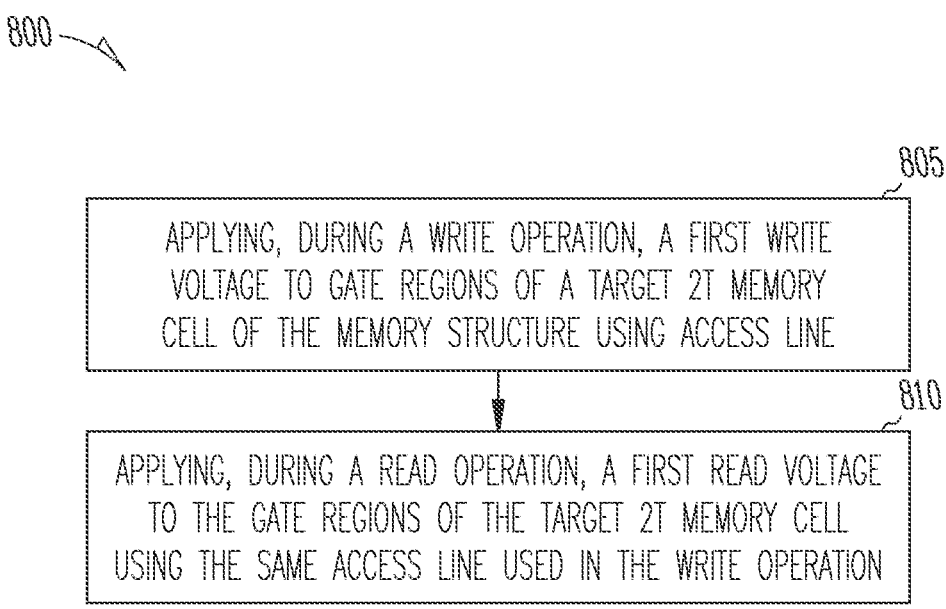
FIG. 8 is a flow diagram of an example of a method 800 of operating a memory device, according to some embodiments described herein.

FIG. 8 is a flow diagram of an example of a method 800 of operating a memory device that includes a memory structure, such as the memory device 200 of FIG. 2. At 805, during a write operation a first write voltage is applied to gate regions (the control gate and write gate regions) of a target or selected 2T memory cell (e.g., memory cell 210 in FIG. 2) using a single access line. As shown in the example of FIG. 7, the first write voltage can be greater than zero volts. A second voltage is applied to the bit lines of a bit line pair (e.g., BL1 and BL1* in FIG. 2) of the memory cell.

Applying the first write voltage that is greater than zero volts to the single access line during the write operation turns off the PFET read transistor of the target 2T memory cell coupled to the single access line, and turns on the NFET write transistor of the 2T memory cell coupled to the single access line. Zero volts can be applied to the access lines and bit lines of non-target memory cells of the memory device. Both the first write voltage and the second write voltage are greater than zero volts. In the example if FIG. 7, the first write voltage can be 3V and the second write voltage can be 1V.

Returning to FIG. 8 at 810, during a read operation a first read voltage is applied to the gate regions of the target 2T memory cell using the same single access line used in the write operation. The first read voltage is less than zero volts (e.g., a negative voltage). Applying the first read voltage less than zero volts to the single access line during the read operation turns on the PFET read transistor of the target 2T memory cell coupled to the single access line, and turns off the NFET write transistor of the 2T memory cell coupled to the single access line. Because the write transistor is an NFET and the read transistor is a PFET, applying the negative voltage to a access line during the read operation will prevent the NFET write transistor from turning on during the read operation.

A second read voltage is applied to one of the bit line of the bit line pair of the target 2T memory cell. The second read voltage is greater than zero volts. Zero volts is applied to the other bit line of the bit line pair during the read operation. In the example of FIG. 6, the first read voltage applied to the access line is −1.0V. The second read voltage of 0.5V is applied to bit line BL1 and zero volts is applied to BL1*. In some embodiments, the write operation programs the 2T memory cell to one of two programmed states. Because the read transistor is a PFET, the read channel portion of the read transistor can be designed so that the voltage threshold (Vt) level of both programmed states is less than zero volts, which prevents the write channel from turning on during a read.

Figure 9A:
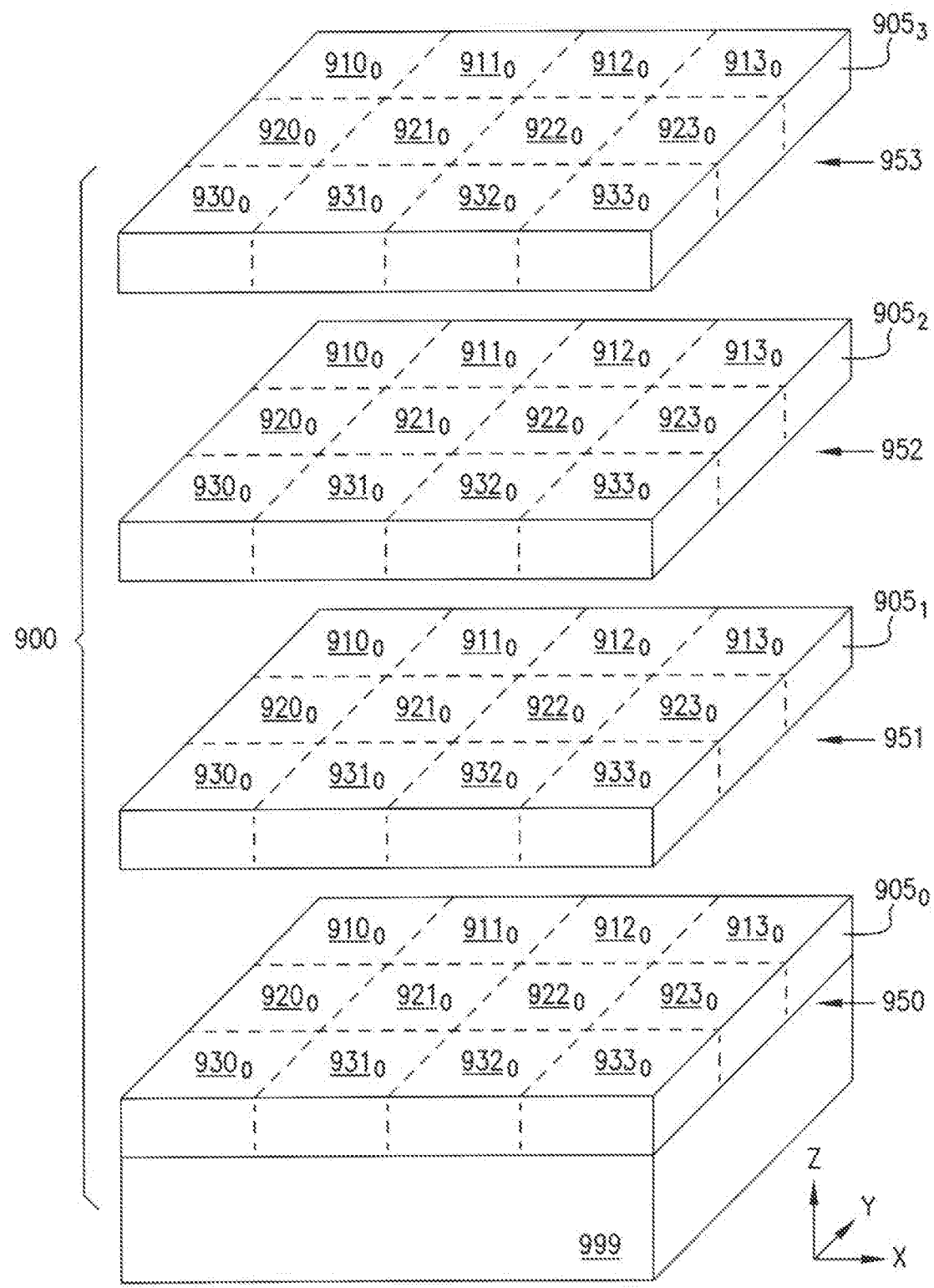
FIGS. 9A, 9B, 9C, show different views of a structure of a memory device including multiple decks of memory cells, according to some embodiments described herein.
Figure 9B:
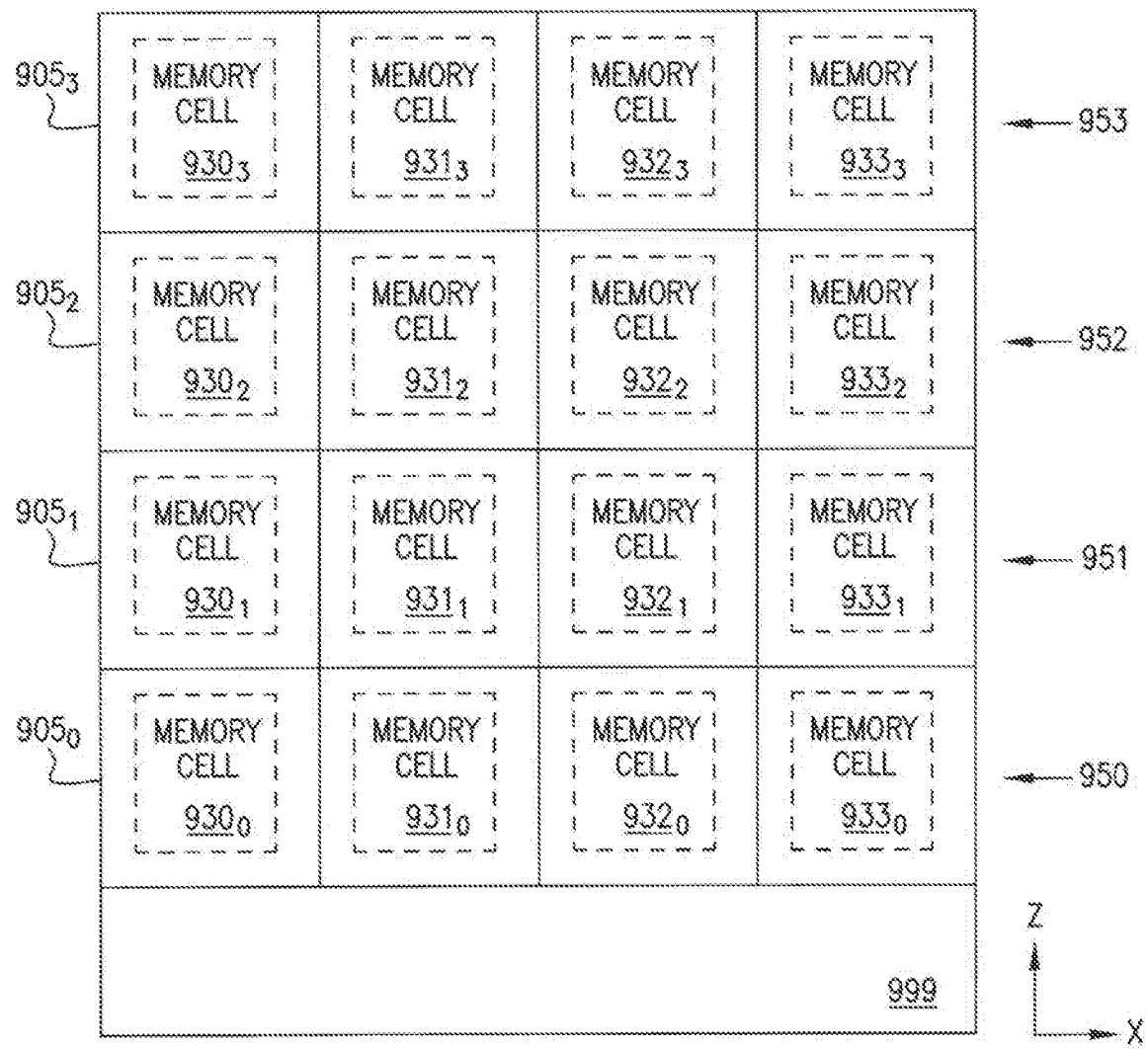
Figure 9C:
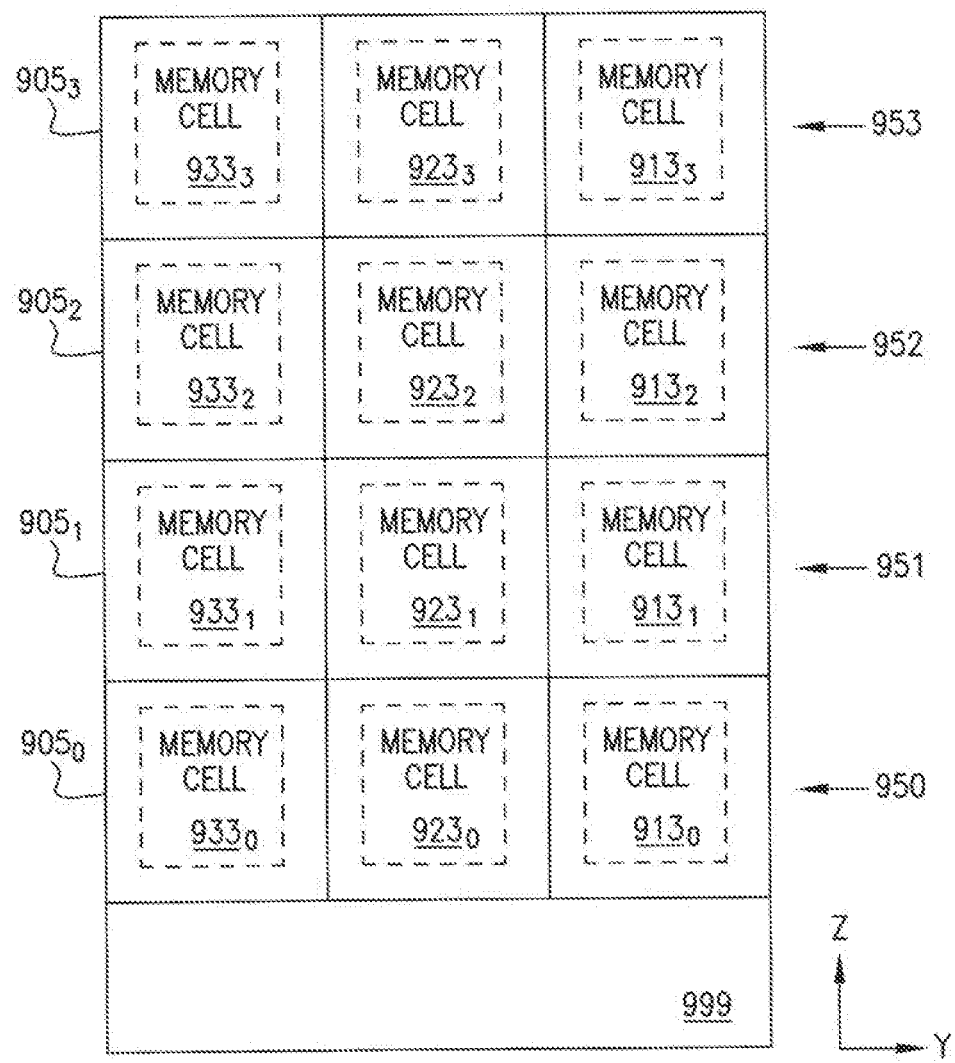

FIG. 9A, FIG. 9B, and FIG. 9C show different views of a structure of a memory device 900 including multiple decks of memory cells, according to some embodiments described herein. FIG. 9A shows an exploded view (e.g., in the Z-direction) of memory device 900. FIG. 9B shows a side view (e.g., cross-sectional view) in the X-direction and the Z-direction of memory device 90. FIG. 9C shows a side view (e.g., cross-sectional view) in the Y-direction and the Z-direction of memory device 900.

As shown in FIG. 9A memory device 900 can include decks (decks of memory cells) $905_0$, $905_1$, $905_2$, and $905_3$ that are shown separately from each other in an exploded view to help ease of viewing the deck structure of memory device 900. In reality, decks $905_0$, $905_1$, $905_2$, and $905_3$ can be attached to each other in an arrangement where one deck can be formed (e.g., stacked) over another deck over a substrate (e.g., a semiconductor (e.g., silicon) substrate) 999. For example, as shown in FIG. 9A, decks $905_0$, $905_1$, $905_2$, and $905_3$ can be formed in the Z-direction perpendicular to substrate 999 (e.g., formed vertically in the Z-direction with respect to substrate 999).

As shown in FIG. 9A, each of decks $905_0$, $905_1$, $905_2$, and $905_3$ can have memory cells arranged in the X-direction and the Y-direction (e.g., arranged in rows in the X-direction and in columns in the Y-direction). For example, deck $905_0$ can include memory cells $910_0$, $911_0$, $912_0$, and $913_0$ (e.g., arranged in a row), memory cells $920_0$, $921_0$, $922_0$, and $923_0$ (e.g., arranged in a row), and memory cells $930_0$, $931_0$, $932_0$, and $933_0$ (e.g., arranged in a row).

Deck $905_1$ can include memory cells $910_1$, $911_1$, $912_1$, and $913_1$ (e.g., arranged in a row), memory cells $920_1$, $921_1$, $922_1$, and $923_1$ (e.g., arranged in a row), and memory cells $930_1$, $931_1$, $932_1$, and $933_1$ (e.g., arranged in a row).

Deck $905_2$ can include memory cells $910_2$, $911_2$, $912_2$, and $913_2$ (e.g., arranged in a row), memory cells $920_2$, $921_2$, $922_2$, and $923_2$ (e.g., arranged in a row), and memory cells $930_2$, $931_2$, $932_2$, and $933_2$ (e.g., arranged in a row). Deck $905_3$ can include memory cells $910_3$, $911_3$, $912_3$, and $913_3$ (e.g., arranged in a row), memory cells $920_3$, $921_3$, $922_3$, and $923_3$ (e.g., arranged in a row), and memory cells $930_3$, $931_3$, $932_3$, and $933_3$ (e.g., arranged in a row).

As shown in FIG. 9A, decks $905_0$, $905_1$, $905_2$, and $905_3$ can be located (e.g., formed vertically in the Z-direction) on levels (e.g., portions) 950, 951, 952, and 953, respectively, of memory device 900. The arrangement of decks $905_0$, $905_1$, $905_2$, and $905_3$ forms a 3-dimensional (3D) structure of memory cells of memory device 900 in that different levels of the memory cells of memory device 900 can be located (e.g., formed) in different levels (e.g., different vertical portions) 950, 951, 952, and 953 of memory device 900.

Decks $905_0$, $905_1$, $905_2$, and $905_3$ can be formed one deck at a time. For example, decks $905_0$, $905_1$, $905_2$, and $905_3$ can be formed sequentially in the order of decks $905_0$, $905_1$, $905_2$, and $905_3$ (e.g., deck $905_1$ is formed first and deck $905_3$ is formed last). In this example, the memory cell of one deck (e.g., deck $905_1$) can be formed either after formation of the memory cells of another deck (e.g., deck $905_0$) or before formation of the memory cells of another deck (e.g., deck $905_2$). Alternatively, decks $905_0$, $905_1$, $905_2$, and $905_3$ can be formed concurrently (e.g., simultaneously), such that the memory cells of decks $905_0$, $905_1$, $905_2$, and $905_3$ can be concurrently formed. For example, the memory cells in levels 950, 951, 952, and 953 of memory device 900 can be concurrently formed.

The structures of the memory cells of each of decks $905_0$, $905_1$, $905_2$, and $905_3$ can include the structures of the memory cells described above with reference to FIG. 1 through FIG. 8. For example, the structures of the of the memory cells of decks $905_0$, $905_1$, $905_2$, and $905_3$ can include the structure of the memory cells of memory devices 600 and 3100.

Memory device 900 can include data lines (e.g., bit lines) and access lines (e.g., word lines) to access the memory cells of decks $905_0$, $905_1$, $905_2$, and $905_3$. For simplicity, data lines and access lines of memory cells are omitted from FIG. 9A. However, the data lines and access lines of memory device 900 can be similar to the data lines and access lines, respectively, of the memory devices described above with reference to FIG. 1 through FIG. 8.

FIG. 9A shows memory device 900 including four decks (e.g., $905_0$, $905_1$, $905_2$, and $905_3$) as an example. However, the number of decks can be different from four. FIG. 9A shows each of decks $905_0$, $905_1$, $905_2$, and $905_3$ including one level (e.g., layer) of memory cells as an example. However, at least one of the decks (e.g., one or more of decks $905_0$, $905_1$, $905_2$, and $905_3$) can have two (or more) levels of memory cells. FIG. 9A shows an example where each of decks $905_0$, $905_1$, $905_2$, and $905_3$ includes four memory cells (e.g., in a row) in the X-direction and three memory cells (e.g., in a column) in the Y-direction. However, the number of memory cells in a row, in a column, or both, can vary.

The illustrations of apparatuses (e.g., memory devices 200) and methods (e.g., operations of memory devices 200) are intended to provide a general understanding of the structure of various embodiments and are not intended to provide a complete description of all the elements and features of apparatuses that might make use of the structures described herein. An apparatus herein refers to, for example, either a device (e.g., any of memory devices 200) or a system (e.g., an electronic item that can include any of memory devices 200).

Any of the components described above with reference to FIG. 1 through FIG. 9C can be implemented in a number of ways, including simulation via software. Thus, apparatuses, e.g., memory devices 200, or part of each of these memory devices described above, may all be characterized as "modules" (or "module") herein. Such modules may include hardware circuitry, single- and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

Memory devices 200 may be included in apparatuses (e.g., electronic circuitry) such as high-speed computers, communication and signal processing circuitry, single- or multi-processor modules, single or multiple embedded processors, multicore processors, message information switches, and application-specific modules including multilayer, multichip modules. Such apparatuses may further be included as subcomponents within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 9C include apparatuses and methods of forming the apparatuses. One of the apparatuses includes a 2T memory cell with complementary read and write channels. Other embodiments including additional apparatuses and methods are described.

ADDITIONAL DESCRIPTION AND EXAMPLES

Example 1 is a memory structure comprising: multiple two-transistor (2T) memory cells, each of the multiple 2T memory cells including: a p-channel field effect transistor (PFET) including a charge storage node and a read channel portion; an n-channel field effect transistor (NFET) including a write channel portion, wherein the write channel portion is directly coupled to the charge storage node of the PFET; a single bit line pair coupled to the read channel portion of the PFET; and a single access line structured to activate both the read channel portion of the PFET and the write channel portion of the NFET.

In Example 2, the subject matter of Example 1 includes a single access line overlaps at least part of each of the read channel portion of the PFET and the write channel portion of the NFET.

In Example 3, the subject matter of any of Examples 1-2 includes one bit line of the single bit line pair that is a write bit line, and wherein the write channel portion is coupled to the write bit line.

In Example 4, the subject matter of any of Examples 1-3 includes a read channel portion of the PFET that comprises two channel portions including a first channel portion arranged adjacent to a first surface of the charge storage node, and a second channel portion arranged adjacent to a second surface of the charge storage node opposite from the first surface of the charge storage node.

In Example 5, the subject matter of any of Examples 1-4 includes a read channel portion of the PFET that is arranged adjacent to a first surface of the charge storage node of the PFET; and wherein each 2T T memory cell further includes a metal shield arranged adjacent to a second surface of the charge storage node of the PFET opposite from the first surface of the storage node.

In Example 6, the subject matter of Example 5 includes each of the 2T memory cells arranged above a substrate and a metal shield that extends in a direction orthogonal to the substrate.

In Example 7, the subject matter of any of Examples 1-6 optionally includes the PFET including p-type polysilicon, and the NFET including n-type gallium phosphide (GaP).

In Example 8, the subject matter of any of Examples 1-6 optionally includes the PFET including p-type polysilicon, and the NFET including n-type semiconducting oxide material.

In Example 9, the subject matter of any of Examples 1-8, wherein the PFET includes a floating gate structure, and the charge storage node is included in the floating gate structure.

In Example 10, the subject matter of Example 9 optionally includes multiple 2T memory cells that are arranged above a substrate; and the access line of a 2T memory cell extends in a direction horizontal to the substrate, and overlaps a portion of the floating gate structure and the at least a portion of the write channel portion of the NFET; and wherein the floating gate structure extends closer to the substrate than the access line.

In Example 11, the subject matter of one or any combination of Examples 1-10 optionally includes a 2T memory cell of the multiple memory cells being a two state memory cell and a voltage threshold (Vt) level of both states of the 2T memory cell is less than zero volts.

In Example 12, the subject matter of any of Examples 1-11 includes the single access line including a first access line portion arranged adjacent to a first side of the charge storage node and a second access line portion arranged adjacent to a second side of the charge storage node, wherein the second side is opposite the first side.

In Example 13, the subject matter of any of Examples 1-12, wherein the memory structure is included in each level of multiple levels of a multi-level memory array.

Example 14 is a method of operating a memory device that includes a memory structure, the method comprising: applying, during a write operation, a first write voltage to gate regions of a target two-transistor (2T) memory cell of the memory structure using a single access line, wherein the first write voltage is greater than zero volts; and applying, during a read operation, a first read voltage to the gate regions of the target 2T memory cell using the same single access line used in the write operation, wherein the first read voltage is less than zero volts.

In Example 15, the subject matter of Example 14 includes applying, during the write operation, a second write voltage to both bit lines of a single bit line pair of the target 2T memory cell, wherein the first write voltage and the second write voltage are greater than zero volts; and applying zero volts to access lines and bit lines of non-target memory cells of the memory device.

In Example 16, the subject matter of any of Examples 14-15 includes applying, during the read operation, a second read voltage to a single bit line of the single bit line pair of the target 2T memory cell, wherein the second read voltage is greater than zero volts; and applying zero volts to the other bit line of the single bit line pair of the target 2T memory cell during the read operation.

In Example 17, the subject matter of any of Examples 14-16 includes applying the first read voltage of less than zero volts to the single access line during the read operation turns on a read transistor of the target 2T memory cell coupled to the single access line, and turns off a write transistor of the 2T memory cell coupled to the single access line; and wherein applying the first write voltage greater than zero volts to the single access line during the write operation turns off the read transistor of the target 2T memory cell coupled to the single access line, and turns on the write transistor of the 2T memory cell coupled to the single access line.

In Example 18, the subject matter of one or any combination of Examples 14-17 optionally includes a write operation that programs the 2T memory cell to one of two programmed states, wherein the voltage threshold (Vt) level of both programmed states is less than zero volts.

Example 19 is a memory array comprising multiple memory cells, wherein each memory cell of the multiple memory cells includes: a charge storage node; a read-write device directly coupled to the charge storage node, wherein the read-write device includes: a p-channel field effect transistor (PFET) including a read channel portion; and an n-channel field effect transistor (NFET) including a write channel portion, wherein the write channel portion directly contacts the charge storage node; a single access line structured to activate both the read channel portion of the PFET and the write channel portion of the NFET; and a single bit line pair coupled to the read channel portion of the read-write device.

In Example 20, the subject matter of Example 19 includes a read channel portion that comprises two sides including: a first channel side arranged adjacent to a first surface of the charge storage node; and a second channel side arranged adjacent to a second surface of the charge storage node opposite from the first surface of the storage node.

In Example 21, the subject matter of any of Examples 19-20 includes a read channel portion that is separate from the write channel portion and is arranged adjacent to one surface of the charge storage node.

In Example 22, the subject matter of any of Examples 19-21 includes one bit line of the single bit line pair being a write bit line, and the write bit line contacts the write channel portion.

In Example 23, the subject matter of any of Examples 19-22 includes a PFET that is a floating gate transistor and the charge storage node is included in a floating gate structure of the floating gate transistor.

In Example 24, the subject matter of any of Examples 1-23 includes the memory array including multiple levels of the memory cell.

In Example 25, the subject matter of any of Examples 1-24 includes the memory array including multiple vertically arranged tiers of memory devices.

In Example 26, the subject matter of any of Examples 1-25 includes memory cells that include a charge storage transistor that comprises a charge trap storage structure.

These non-limiting Examples can be combined in any permutation or combination. In the detailed description and the claims, a list of items joined by the term "at least one of" can mean any combination of the listed items. For example, if items A and B are listed, then the phrase "at least one of A and B" means A only; B only; or A and B. In another example, if items A, B, and C are listed, then the phrase "at least one of A, B and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

In the detailed description and the claims, a list of items joined by the term "one of" can mean only one of the list items. For example, if items A and B are listed, then the phrase "one of A and B" means A only (excluding B), or B only (excluding A). In another example, if items A, B, and C are listed, then the phrase "one of A, B and C" means A only; B only; or C only. Item A can include a single element or multiple elements. Item B can include a single element or multiple elements. Item C can include a single element or multiple elements.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. A memory structure comprising:
   multiple two-transistor (2T) memory cells, each of the multiple 2T memory cells including:
   a p-channel field effect transistor (PFET) including a charge storage node and a read channel portion;
   an n-channel field effect transistor (NFET) including a write channel portion, wherein the write channel portion is directly coupled to the charge storage node of the PFET;
   a single bit line pair coupled to the read channel portion of the PFET; and
   a single access line structured to activate both the read channel portion of the PFET and the write channel portion of the NFET.

2. The memory structure of claim 1, wherein the single access line overlaps at least part of each of the read channel portion of the PFET and the write channel portion of the NFET.

3. The memory structure of claim 1, wherein one bit line of the single bit line pair is a write bit line, and wherein the write channel portion is coupled to the write bit line.

4. The memory structure of claim 1, wherein the read channel portion of the PFET comprises two channel portions including a first channel portion arranged adjacent to a first surface of the charge storage node, and a second channel portion arranged adjacent to a second surface of the charge storage node opposite from the first surface of the charge storage node.

5. The memory structure of claim 1, wherein the read channel portion of the PFET is arranged adjacent to a first surface of the charge storage node of the PFET; and
   wherein each 2T memory cell further includes a metal shield arranged adjacent to a second surface of the charge storage node of the PFET opposite from the first surface of the storage node.

6. The memory structure of claim 5, wherein each 2T memory cell is arranged above a substrate and the metal shield extends in a direction orthogonal to the substrate.

7. The memory structure of claim 1, wherein the PFET includes p-type polysilicon, and the NFET includes n-type gallium phosphide (GaP).

8. The memory structure of claim 1, wherein the PFET includes p-type polysilicon, and the NFET includes n-type semiconducting oxide material.

9. The memory structure of claim 1, wherein the PFET includes a floating gate structure, and the charge storage node is included in the floating gate structure.

10. The memory structure of claim 9,
    wherein the multiple 2T memory cells are arranged above a substrate and the access line of a 2T memory cell extends in a direction horizontal to the substrate, and overlaps a portion of the floating gate structure and the at least a portion of the write channel portion of the NFET; and
    wherein the floating gate structure extends closer to the substrate than the access line.

11. The memory structure of claim 1, wherein a 2T memory cell of the multiple memory cells is a two state memory cell and a voltage threshold (Vt) level of both states of the 2T memory is less than zero volts.

12. The memory structure of claim 1, wherein the single access line includes a first access line portion arranged adjacent to a first side of the charge storage node and a second access line portion arranged adjacent to a second side of the charge storage node, wherein the second side is opposite the first side.

13. The memory structure of claim 1, wherein the memory structure is included in each level of multiple levels of a multi-level memory array.

14. A method of operating a memory device that includes a memory structure, the method comprising:
    applying, during a write operation, a first write voltage to gate regions of a target two-transistor (2T) memory cell of the memory structure using a single access line, wherein the first write voltage is greater than zero volts; and
    applying, during a read operation, a first, read voltage to the gate regions of the target 2T memory cell using the same single access line used in the write operation, wherein the first read voltage is less than zero volts.

15. The method of claim 14, including:
    applying, during the write operation, a second write voltage to both bit lines of a single bit line pair of the target 2T memory cell, wherein the first write voltage and the second write voltage are greater than zero volts; and
    applying zero volts to access lines and bit lines of non-target memory cells of the memory device.

16. The method of claim 14, including:
    applying, during the read operation, a second read voltage to a single bit line of the single bit line pair of the target 2T memory cell, wherein the second read voltage is greater than zero volts; and
    applying zero volts to the other bit line of the single bit line pair of the target 2 T memory cell during the read operation.

17. The method of claim 14,
    wherein applying the first read voltage less than zero volts to the single access line during the read operation turns on a read transistor of the target 2T memory cell coupled to the single access line, and turns off a write transistor of the 2T memory cell coupled to the single access line; and
    wherein applying the first write voltage greater than zero volts to the single access line during the write operation turns off the read transistor of the target 2T memory cell coupled to the single access line, and turns on the write transistor of the 2T memory cell coupled to the single access line.

18. The method of claim 14, wherein the write operation programs the 2T memory cell to one of two programmed states, wherein the voltage threshold (Vt) level of both programmed states is less than zero volts.

19. A memory array comprising multiple memory cells, wherein each memory cell of the multiple memory cells includes:
- a charge storage node;
- a read-write device directly coupled to the charge storage node, wherein the read-write device includes:
- a p-channel field effect transistor (PFET) including a read channel portion; and
- an n-channel field effect transistor (NFET) including a write channel portion, wherein the write channel portion directly contacts the charge storage node;
- a single access line structured to activate both the read channel portion of the PFET and the write channel portion of the NFET; and
- a single bit line pair coupled to the read channel portion of the read-write device.

20. The memory array of claim 19, wherein the read channel portion comprises two sides including:
- a first channel side arranged adjacent to a first surface of the charge storage node; and
- a second channel side arranged adjacent to a second surface of the charge storage node opposite from the first surface of the storage node.

21. The memory array of claim 19, wherein the read channel portion is separate from the write channel portion and is arranged adjacent to one surface of the charge storage node.

22. The memory array of claim 19, wherein one bit line of the single hit line pair is a write hit line, and the write hit line contacts the write channel portion.

23. The memory array of claim 19, wherein the PFET is a floating gate transistor and the charge storage node is included in a floating gate structure of the floating gate transistor.

24. The memory array of claim 19, wherein the memory array includes multiple levels of the memory cells.

* * * * *